United States Patent
Zeng et al.

(10) Patent No.: US 10,418,426 B2
(45) Date of Patent: Sep. 17, 2019

(54) ORGANIC LIGHT-EMITTING DISPLAY PANEL AND ELECTRONIC DEVICE

(71) Applicant: SHANGHAI TIANMA MICRO-ELECTRONICS CO., LTD., Shanghai (CN)

(72) Inventors: Yang Zeng, Shanghai (CN); Qing Zhang, Shanghai (CN); Lihua Wang, Shanghai (CN); Liang Liu, Shanghai (CN); Feng Lu, Shanghai (CN); Shaolong Ma, Shanghai (CN); Qijun Yao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 20 days.

(21) Appl. No.: 15/786,556

(22) Filed: Oct. 17, 2017

(65) Prior Publication Data

US 2018/0040673 A1 Feb. 8, 2018

(30) Foreign Application Priority Data

Jun. 30, 2017 (CN) .......................... 2017 1 0522410

(51) Int. Cl.
| | | |
|---|---|---|
| *H01L 27/32* | (2006.01) | |
| *H01L 51/52* | (2006.01) | |
| *G06F 3/047* | (2006.01) | |
| *G06F 3/041* | (2006.01) | |
| *G06F 3/042* | (2006.01) | |

(52) U.S. Cl.
CPC .......... *H01L 27/323* (2013.01); *G06F 3/047* (2013.01); *G06F 3/0412* (2013.01); *G06F 3/0414* (2013.01); *G06F 3/0421* (2013.01); *H01L 27/3225* (2013.01); *H01L 27/3234* (2013.01); *H01L 51/5203* (2013.01); *G06F 2203/04106* (2013.01)

(58) Field of Classification Search
CPC .............. G09G 3/3233; H01L 27/3225; H01L 27/3227; H01L 27/323; H01L 27/3234
See application file for complete search history.

(56) References Cited

U.S. PATENT DOCUMENTS

| | | | |
|---|---|---|---|
| 2010/0007632 A1* | 1/2010 | Yamazaki | H01L 27/3234 345/175 |
| 2018/0046277 A1* | 2/2018 | Ding | G06F 3/0412 |

FOREIGN PATENT DOCUMENTS

| | | |
|---|---|---|
| CN | 105511679 A | 4/2016 |
| CN | 106445242 A | 2/2017 |

* cited by examiner

*Primary Examiner* — Dong Hui Liang
(74) *Attorney, Agent, or Firm* — Kilpatrick Townsend & Stockton LLP

(57) ABSTRACT

Disclosed are an organic light-emitting display panel and an electronic device. The organic light-emitting display panel comprises a first substrate; the first substrate comprises a plurality of pressure-sensitive detection structures and a plurality of light-sensitive identification structures provided in an array, the pressure-sensitive detection structure comprises a semiconductor material film, the light-sensitive identification structure comprises a light-sensitive identification switch, the light-sensitive identification switch comprises a first active layer, and the semiconductor material film and the first active layer are provided on the same layer.

15 Claims, 22 Drawing Sheets

ORGANIC LIGHT-EMITTING DISPLAY PANEL AND ELECTRONIC DEVICE

CROSS-REFERENCE TO RELATED APPLICATIONS

This application claims priority to Chinese Patent Application No. 201710522410.6, filed on Jun. 30, 2017 and entitled "ORGANIC LIGHT-EMITTING DISPLAY PANEL AND ELECTRONIC DEVICE", the disclosure of which is incorporated herein by reference in its entirety.

TECHNICAL FIELD

Embodiments of the present disclosure relates to display technologies, and in particular, to an organic light-emitting display panel and an electronic device.

BACKGROUND

With the rapid development of the technologies of portable electronic terminal devices, especially mobile phones and tablets, more and more novel technologies are applied to these electronic terminal devices. Pressure-sensitive touch technology is one of the novel technologies for attention in the field currently. Touch screens integrated with the pressure-sensitive touch screen technology may clearly distinguish between touch and press. When a user presses a screen, the touch screen integrated with a pressure sensor can exactly identify the pressure transferred by the user on the touch surface, thereby realizing different operations, for example, invoking more control options in applications such as Message, Music and Calendar, etc.

The existing pressure sensor is generally integrated on the periphery of a display to detect whether the display is pressed and detect the magnitude of the pressure. In the existing manufacture process, the pressure sensor needs to be separately provided on the periphery of the display, and hence the manufacture process will be added.

SUMMARY

The present disclosure provides an organic light-emitting display panel and an electronic device to reduce the manufacture processes and lowering the costs.

In a first aspect, embodiments of the application provide an organic light-emitting display panel, which comprise:
a first substrate;
the first substrate includes a plurality of pressure-sensitive detection structures and a plurality of light-sensitive identification structures provided in an array, the pressure-sensitive detection structure includes a semiconductor material film, the light-sensitive identification structure includes a light-sensitive identification switch, and the light-sensitive identification switch includes a first active layer, wherein, the semiconductor material film and the first active layer are provided on the same layer.

In a second aspect, embodiments of the disclosure further provide an electronic device including the above organic light-emitting display panel.

In the embodiments of the disclosure, the organic light-emitting display panel is integrated with a pressure-sensitive detection structure, so that pressure sensing can be performed, thereby realizing the pressure-sensitive touch technology. Moreover, the organic light-emitting display panel is further integrated with a light-sensitive identification structure, so that fingerprint identification, full-screen fingerprint touch control and identification can be performed via light-sensitive detection, thereby realizing the light-sensitive touch technology. In the embodiments of the disclosure, the specific location of the pressure-sensitive detection structure is not limited, and the pressure-sensitive detection structure may be provided in a display region or a non-display region of the organic light-emitting display panel. In comparison with the prior art, the pressure-sensitive detection structure is provided in the display region of the organic light-emitting display panel, so that narrow frame can be realized; moreover, the semiconductor material film of the pressure-sensitive detection structure and the first active layer of the light-sensitive identification switch are provided on the same layer. Also, in comparison with the prior art, the manufacture processes may be reduced and the costs may be lowered while realizing the light-sensitive touch technology and pressure-sensitive touch technology.

BRIEF DESCRIPTION OF THE DRAWINGS

Drawings needed in the embodiments of the disclosure will be introduced briefly below for more clearly illustrating the technical solutions of the exemplary embodiments of the disclosure. It will be apparent that, the drawings merely illustrate exemplary embodiments of the disclosure. Those skilled in the art can conceive other drawings from the illustrated drawings without inventive efforts.

DETAILED DESCRIPTION

The application will be illustrated in detail in conjunction with the drawings and embodiments. It may be understood that, the embodiments described here are only set for explaining, rather than limiting, the application. Additionally, it further needs to be noted that, for convenient description, the drawings only show the parts related to the application, rather than the whole structure.

Figure 1A:
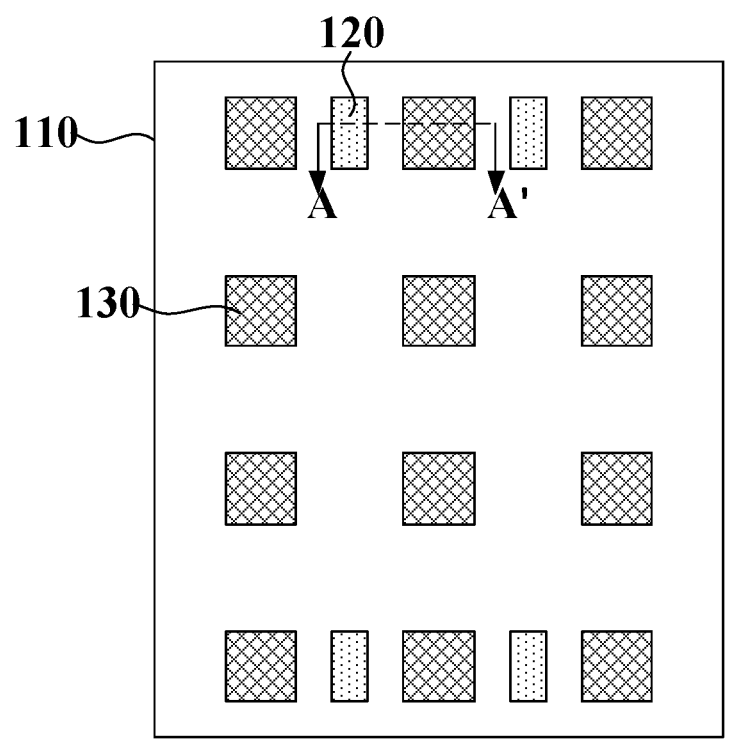
FIG. 1A is a schematic diagram of an organic light-emitting display panel according to an embodiment of the disclosure.
Figure 1B:
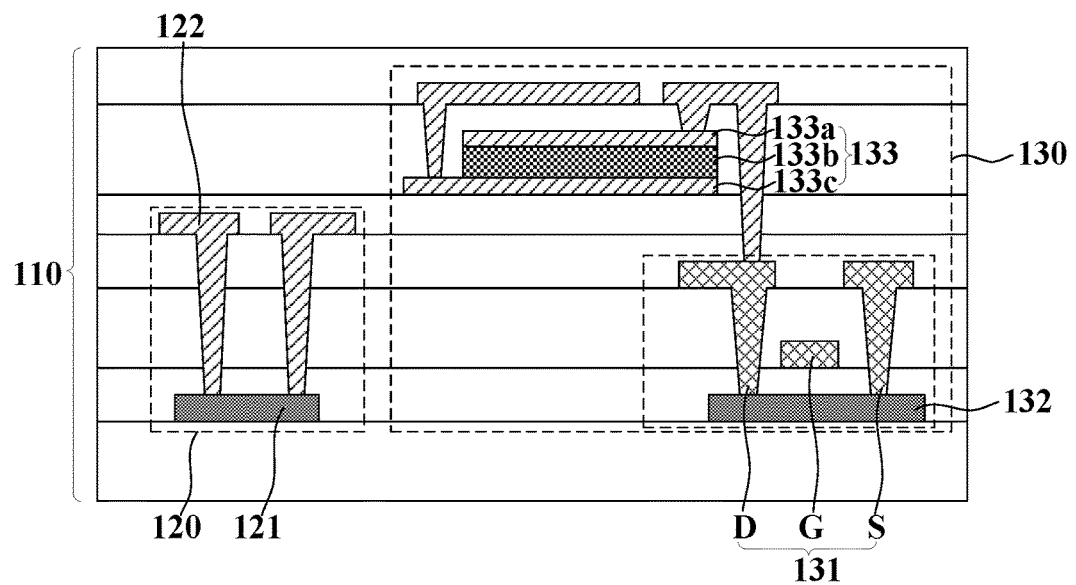
FIG. 1B is a sectional view of FIG. 1A along A-A'.

FIG. 1A is a schematic diagram of an organic light-emitting display panel according to an embodiment of the disclosure, and FIG. 1B is a sectional view of FIG. 1A along A-A'. Referring to FIG. 1A and FIG. 1B, the organic light-emitting display panel according to the embodiment of the disclosure includes: a first substrate 110; the first substrate 110 includes a plurality of pressure-sensitive detection structures 120 and a plurality of light-sensitive identification structures 130 provided in an array, the pressure-sensitive detection structure 120 includes a semiconductor material film 121, the light-sensitive identification structure 130 includes a light-sensitive identification switch 131, and the light-sensitive identification switch 131 includes a first active layer 132, wherein, the semiconductor material film 121 and the first active layer 132 are provided on the same layer.

In the embodiment of the disclosure, the organic light-emitting display panel inputs a drive voltage signal to the pressure-sensitive detection structure 120. When a user presses the surface of a touch panel, the pressure-sensitive detection structure 120 is deformed under the pressure, and the strain voltage on the output terminal of the pressure-sensitive detection structure 120 is changed correspondingly according to the degree of deformation, so that the magnitude of the pressure may be detected by detecting the strain voltage.

In the embodiment of the disclosure, the light-sensitive identification switch 131 further includes: a first gate electrode G and a first drain electrode D. The light-sensitive identification structure 130 further includes a light-sensitive identification apparatus 133 provided corresponding to the light-sensitive identification switch 131; the light-sensitive identification apparatus 133 includes: a PN junction 133b with a photosensitive characteristic, a first pole 133a electrically connected with one end of the PN junction 133b and a second pole 133c electrically connected with the other end of the PN junction 133b, wherein, the first pole 133a of the light-sensitive identification apparatus 133 is electrically connected with the first drain electrode D of the corresponding light-sensitive identification switch 131.

In the embodiment of the disclosure, the light-sensitive identification switch 131 further includes a first source electrode S, and the first source electrode S is electrically connected with a light-sensitive data line (not shown), the light-sensitive identification switch 131 is configured to be turned on in the light-sensitive detection stage and be turned off in other working stages, wherein, the light-sensitive detection stage includes a data write stage and a data read stage. In the data write stage, a light-sensitive detection circuit of the organic light-emitting display panel controls the light-sensitive identification switch 131 to be turned on and writes a light-sensitive drive signal on the light-sensitive data line into the corresponding light-sensitive identification apparatus 133 via the light-sensitive identification switch 131; in the data read stage, the light-sensitive detection circuit again controls the light-sensitive identification switch 131 to be turned on and acquires a light-sensitive induction signal from the corresponding light-sensitive identification apparatus 133 via the light-sensitive data line and the light-sensitive identification switch 131. The light-sensitive detection circuit performs fingerprint identification and/or fingerprint touch control according to the change of the light-sensitive induction signal and the light-sensitive drive signal. It may be understood by one skilled in the art that, the specific structure and working process of the light-sensitive identification structure are similar to those in the prior art, and hence it will not be described again here.

In the light-sensitive detection stage, the organic light-emitting display panel writes a light-sensitive drive signal into the light-sensitive identification apparatus 133 via the light-sensitive identification switch 131. When a user touches the surface of a touch panel, the light-sensitive identification apparatus 133 receives reflected light and converts the reflected light received into an electrical signal, the reflected light is formed by reflecting, by a touch body on the organic light-emitting display panel, the light emitted from the organic light-emitting display panel. The different intensity of the reflected light will lead to the different electrical signal generated by the light-sensitive identification apparatus 133. The organic light-emitting display panel reads the electrical signal from the light-sensitive identification apparatus 133 via the light-sensitive identification switch 131. Therefore, the organic light-emitting display panel determines the touch body information according to the electrical signal from each of the light-sensitive identification apparatuses 133. The touch body is a finger of the user, and hence the reflected light received by the light-sensitive identification apparatus 133 is formed by the light reflected by the valleys and ridges of the finger, which is initially emitted from the organic light-emitting display panel, and the organic light-emitting display panel can determine the texture information of the valleys and ridges of the finger according to the electrical signal from the light-sensitive identification apparatus 133, thereby realizing fingerprint identification. On the other hand, the organic light-emitting display panel is integrated with a plurality of light-sensitive identification structures 130 provided in an array, the light-sensitive identification apparatus 133 generates an electrical signal according to the received reflected light and reads the electrical signal from the light-sensitive identification apparatus 133 via the light-sensitive identification switch 131, so that the organic light-emitting display panel can determine the finger location information according to the electrical signal from each of the light-sensitive identification apparatuses 133, thereby realizing full-screen fingerprint touch control and identification.

In the embodiment of the disclosure, the light-sensitive identification switch 131 is a thin-film transistor, the structure of the thin-film transistor includes an active layer, a gate electrode and drain and source electrodes, and the active layer of the thin-film transistor will function as the first active layer 132 of the light-sensitive identification switch 131.

The semiconductor material film 121 of the pressure-sensitive detection structure 120 may be made from amorphous silicon a-Si or polysilicon poly-Si. The first active layer 132 of the light-sensitive identification switch 131 may be made from polysilicon poly-Sior or amorphous silicon a-Si. Therefore, in the embodiment of the disclosure, the semiconductor material film 121 and the first active layer 132 are provided on the same layer. Specifically, the semiconductor material film 121 and the first active layer 132 may optionally be made from the same materials and be formed on the same layer via one mask. Therefore, both the pressure-sensitive detection structure 120 and the light-sensitive identification structure 130 may be formed in the organic light-emitting display panel without additional processes or the costs.

It needs to be noted that, in other embodiments, the first active layer of the light-sensitive identification switch may optionally be made from a semiconductor oxide such as zinc oxide, indium oxide and tin oxide, etc., or it may optionally be made from an alloy with zinc oxide, indium oxide and tin oxide, etc. The semiconductor material film of the pressure-sensitive detection structure and the first active layer of the light-sensitive identification switch are provided on the same layer.

In the embodiment of the disclosure, the organic light-emitting display panel is integrated with a pressure-sensitive detection structure, so that pressure sensing can be performed to realize the pressure-sensitive touch technology.

Moreover, the organic light-emitting display panel is further integrated with a light-sensitive identification structure so that fingerprint identification, full-screen fingerprint touch control and identification can be performed via light-sensitive detection, thereby realizing the light-sensitive touch technology. In the embodiment of the disclosure, the specific location of the pressure-sensitive detection structure is not limited, and the pressure-sensitive detection structure may be provided in a display region or a non-display region of the organic light-emitting display panel. In comparison with the prior art, by providing the pressure-sensitive detection structure in the display region of the organic light-emitting display panel, narrow frame can be realized; also, the semiconductor material film of the pressure-sensitive detection structure and the first active layer of the light-sensitive identification switch are provided on the same layer, so that the manufacture processes may be reduced and the costs may be lowered while realizing the light-sensitive touch technology and pressure-sensitive touch technology in comparison with the prior art.

Figure 1C:
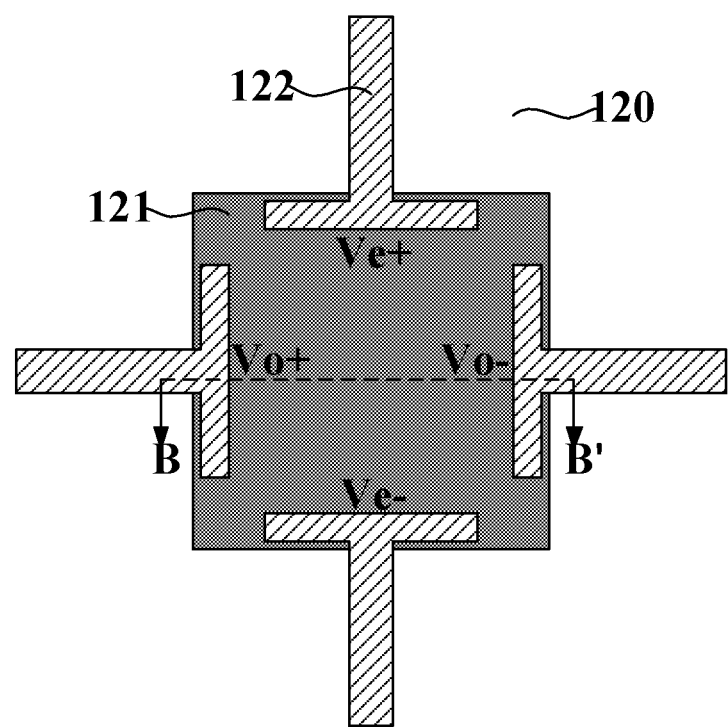
FIG. 1C is a schematic diagram of a pressure-sensitive detection structure according to an embodiment of the disclosure.

Optionally, referring to FIG. 1B and FIG. 1C, the pressure-sensitive detection structure 120 further includes: a pressure-sensitive wiring 122 electrically connected with the semiconductor material film 121. In the embodiment of the disclosure, the pressure-sensitive detection structure 120 is provided as a semiconductor pressure-sensitive detection structure, and the pressure-sensitive detection structure 120 includes a semiconductor material film 121 and four connection terminals, wherein the four connection terminals include two voltage input terminals (Vo+ and Vo−) and two voltage output terminals (Ve+ and Ve−). The four connection terminals are electrically connected with four pressure-sensitive wirings 122, wherein line including the two voltage input terminals intersects with the line including the two voltage output terminals. The semiconductor material film 121 of the pressure-sensitive detection structure 120 has a square structure, and in other embodiments, it has a polygonal structure. The four pressure-sensitive wirings 122 of the pressure-sensitive detection structure 120 are divided into two voltage input wirings electrically connected with the two voltage input terminals respectively and two voltage output wirings electrically connected with the two voltage output terminals respectively. It needs to be noted that, the pressure-sensitive detection structure 120 shown in FIG. 1B is an illustration of FIG. 1C along B-B', and thus FIG. 1B only shows two pressure-sensitive wirings 122.

In the embodiment of the disclosure, the organic light-emitting display panel inputs a drive voltage signal to the pressure-sensitive detection structure 120 via two voltage input wirings, and detects, via two voltage output wirings, the strain voltage signal outputted by the pressure-sensitive detection structure 120. If no user presses the surface of the touch panel, the strain voltage signal outputted by the pressure-sensitive detection structure 120 will be 0; if a user presses the surface of the touch panel, the pressure-sensitive detection structure 120 is deformed under the action of the pressure, so that the strain voltage signal outputted by the pressure-sensitive detection structure 120 changes correspondingly according to the degree of deformation, thereby realizing pressure-sensitive touch on the organic light-emitting display panel by detecting the strain voltage signal. It may be understood by one skilled in the art that, the specific structure and working process of the pressure-sensitive detection structure are similar to those in the prior art, and it will not be described again here.

Figure 2:
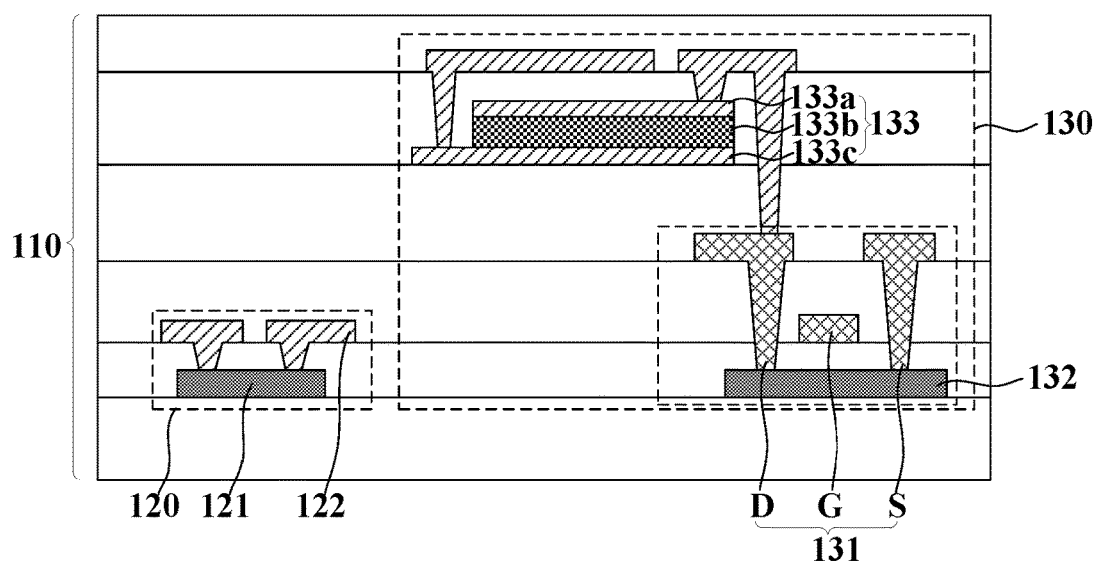
FIG. 2-FIG. 7 are schematic diagrams of various organic light-emitting display panels according to the embodiments of the disclosure.

Optionally, referring to FIG. 2, the difference of the organic light-emitting display panel shown in FIG. 2 from any of the above organic light-emitting display panels lies in that, the first gate electrode G of the light-sensitive identification switch 131 and the pressure-sensitive wiring 122 of the pressure-sensitive detection structure 120 are provided on the same layer. In the embodiment of the disclosure, the first gate electrode G of the light-sensitive identification switch 131 and the pressure-sensitive wiring 122 of the pressure-sensitive detection structure 120 are both formed via one mask, and the materials for the first gate electrode G of the light-sensitive identification switch 131 and for the pressure-sensitive wiring 122 of the pressure-sensitive detection structure 120 are the same with each other, so that not only one mask process can be omitted, but also one insulating layer and one metal layer may be omitted, thereby lowering the costs, reducing the manufacture processes and reducing the thickness of the organic light-emitting display panel.

Figure 3:
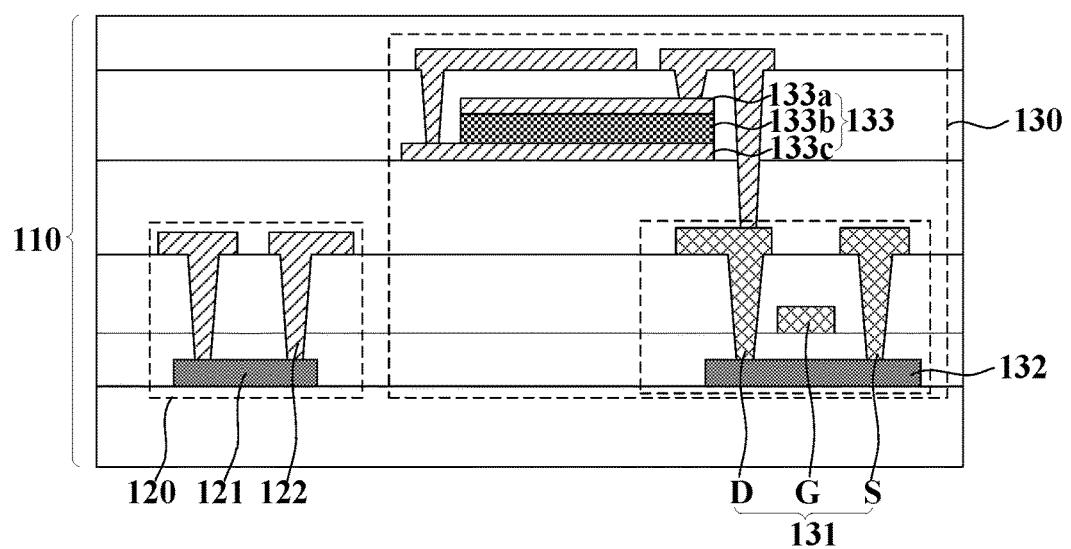

Optionally, referring to FIG. 3, the difference of the organic light-emitting display panel shown in FIG. 3 from any of the above organic light-emitting display panels lies in that, the first drain electrode D of the light-sensitive identification switch 131 and the pressure-sensitive wiring 122 of the pressure-sensitive detection structure 120 are provided on the same layer. In the embodiment of the disclosure, the first drain electrode D of the light-sensitive identification switch 131 and the pressure-sensitive wiring 122 of the pressure-sensitive detection structure 120 are both formed via one mask, and the materials for the first drain electrode D of the light-sensitive identification switch 131 and for the pressure-sensitive wiring 122 of the pressure-sensitive detection structure 120 are the same with each other, so that not only one mask process can be omitted, but also one insulating layer and one metal layer may be omitted, thereby lowering the costs, reducing the manufacture processes and reducing the thickness of the organic light-emitting display panel.

Figure 4:
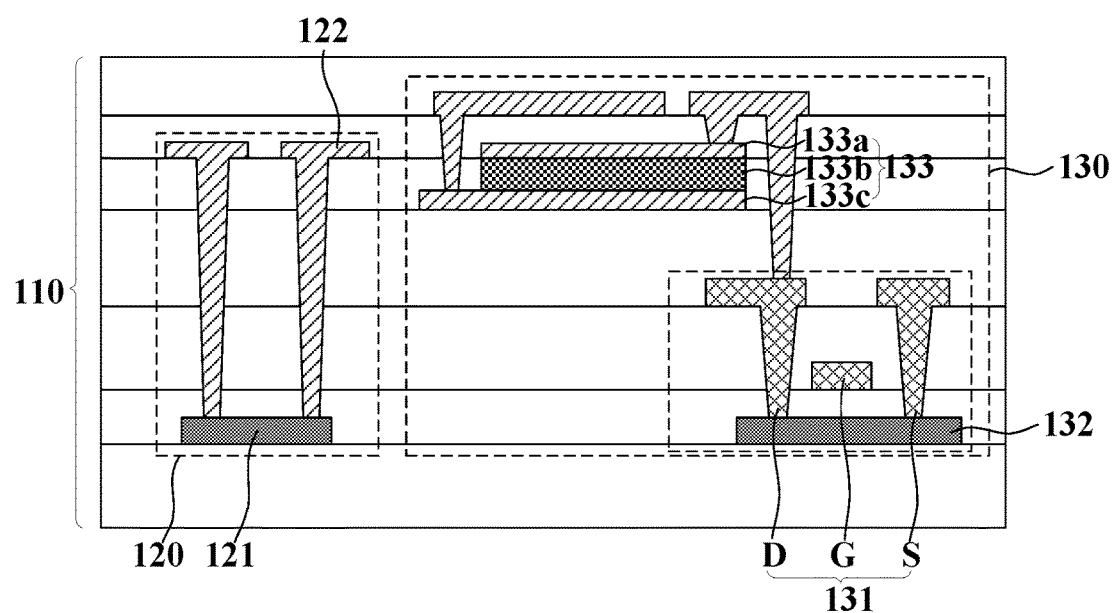

Optionally, referring to FIG. 4, the difference of the organic light-emitting display panel shown in FIG. 4 from any of the above organic light-emitting display panels lies in that, the first pole 133a of the light-sensitive identification apparatus 133 and the pressure-sensitive wiring 122 are provided on the same layer. In the embodiment of the disclosure, the first pole 133a of the light-sensitive identification apparatus 133 and the pressure-sensitive wiring 122 of the pressure-sensitive detection structure 120 are both formed via one mask, and the materials for the first pole 133a of the light-sensitive identification apparatus 133 and for the pressure-sensitive wiring 122 of the pressure-sensitive detection structure 120 are the same with each other, so that not only one mask process can be omitted, but also one insulating layer and one metal layer may be omitted, thereby lowering the costs, reducing the manufacture processes and reducing the thickness of the organic light-emitting display panel.

Figure 5:
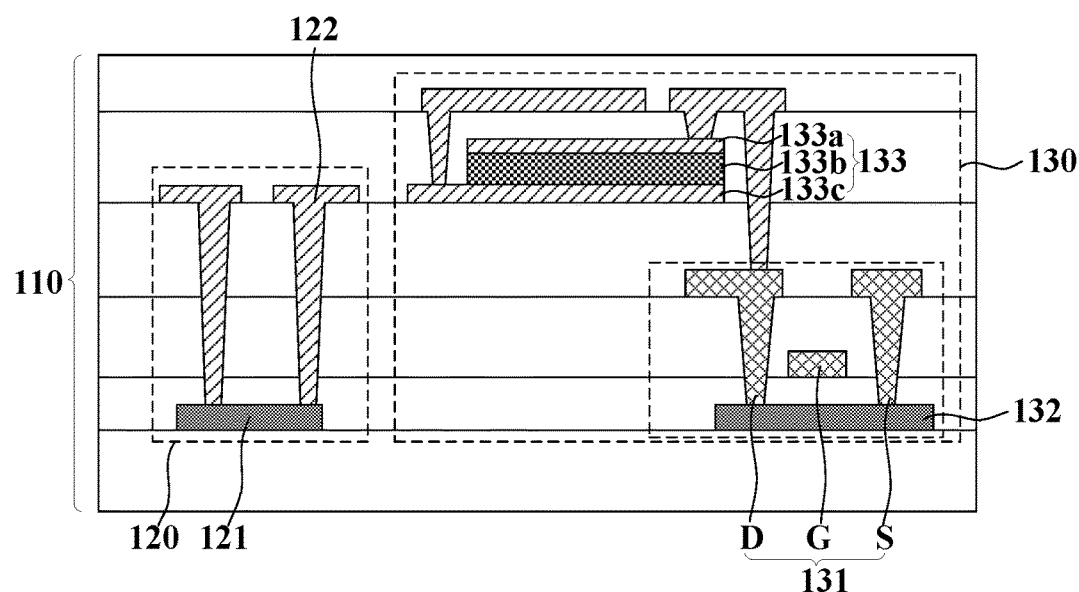

Optionally, referring to FIG. 5 the difference of the organic light-emitting display panel shown in FIG. 5 from any of the above organic light-emitting display panels lies in that, the second pole 133c of the light-sensitive identification apparatus 133 and the pressure-sensitive wiring 122 are provided on the same layer. In the embodiment of the disclosure, the second pole 133c of the light-sensitive identification apparatus 133 and the pressure-sensitive wiring 122 of the pressure-sensitive detection structure 120 are both formed via one mask, and the materials for the second pole 133c of the light-sensitive identification apparatus 133 and for the pressure-sensitive wiring 122 of the pressure-sensitive detection structure 120 are the same with each other, so that not only one mask process can be omitted, but also one insulating layer and one metal layer may be omitted, thereby lowering the costs, reducing the manufacture processes and reducing the thickness of the organic light-emitting display panel.

Figure 6:
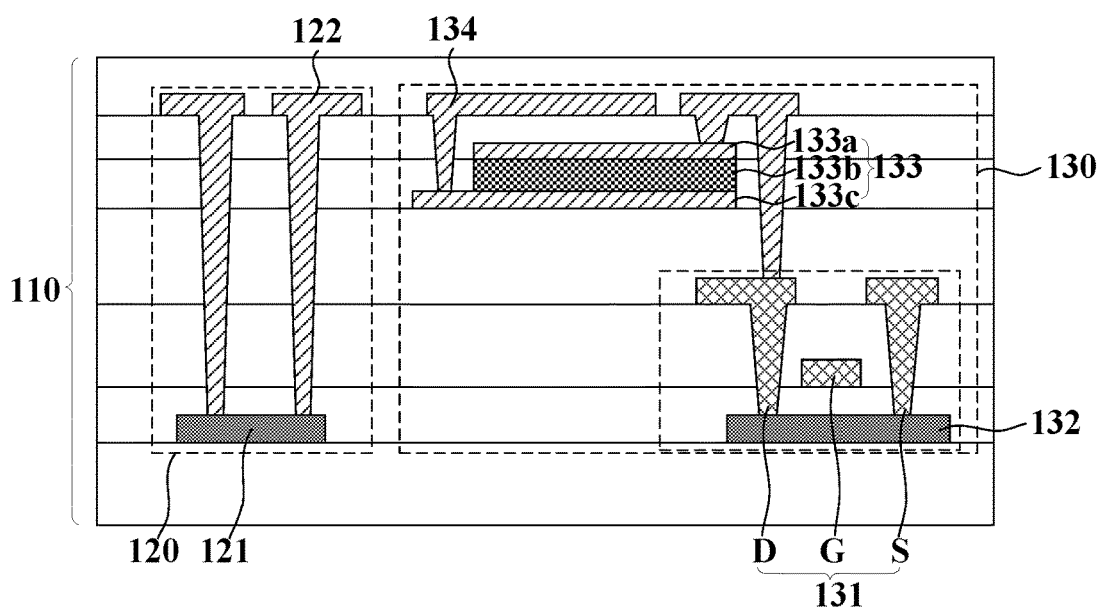

Optionally, referring to FIG. 6, the light-sensitive identification structure 130 further includes: a common voltage input layer 134, wherein the second pole 133c of the light-sensitive identification apparatus 133 is electrically connected with the common voltage input layer 134. The difference between the organic light-emitting display panel shown in FIG. 6 and any of the above organic light-emitting display panels lies in that, the common voltage input layer 134 and the pressure-sensitive wiring 122 are provided on the same layer. In the embodiment of the disclosure, the common voltage input layer 134 of the light-sensitive identification structure 130 and the pressure-sensitive wiring 122 of the pressure-sensitive detection structure 120 are both formed via one mask, and the materials for the common voltage input layer 134 of the light-sensitive identification structure 130 and for the pressure-sensitive wiring 122 of the pressure-sensitive detection structure 120 are the same with each other, so that not only one mask process can be omitted, but also one insulating layer and one metal layer may be omitted, thereby lowering the costs, reducing the manufacture processes and reducing the thickness of the organic light-emitting display panel.

Figure 7:
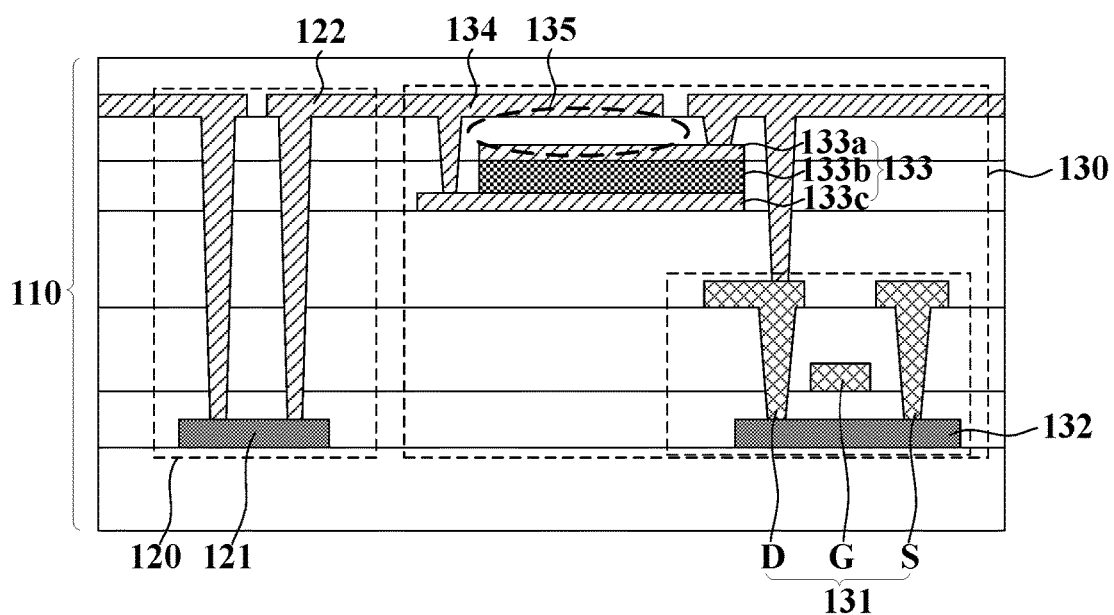

Optionally, referring to FIG. 7, the common voltage input layer 134 is multiplexed as the pressure-sensitive wiring 122. In the embodiment of the disclosure, an entire common voltage input metal film layer may be formed, and the common voltage input layer 134 of the light-sensitive identification structure 130 and the pressure-sensitive wiring 122 of the pressure-sensitive detection structure 120 are both formed via one mask. It needs to be noted that, the common voltage input layer 134 is multiplexed as the two pressure-sensitive drive wirings 122 in the pressure-sensitive detection structure 120. Further the common voltage input layer 134 is multiplexed as the two pressure-sensitive induction wirings 122 in the pressure-sensitive detection structure 120. Optionally, as shown in FIG. 7, the common voltage input layer 134 and the two pressure-sensitive drive wirings 122 in the pressure-sensitive detection structure 120 are shared with each other, or, the common voltage input layer 134 and the two pressure-sensitive induction wirings 122 in the pressure-sensitive detection structure 120 are shared with each other. Further, a plurality of common voltage input layers 134 and a plurality of pressure-sensitive wirings 122 independent of the common voltage input layers 134 are formed as shown in FIG. 6 after forming the entire common voltage input metal film layer, and in the light-sensitive detection stage, a common voltage signal is applied to the common voltage input layer 134 and the pressure-sensitive wiring 122.

The light-sensitive identification structure 130 includes a light-sensitive storage capacitor 135, the common voltage input layer 134 function as one pole of the light-sensitive storage capacitor 135, and the first pole 133a of the light-sensitive identification apparatus 133 function as the other pole of the light-sensitive storage capacitor 135, and the overlapped region of the common voltage input layer 134 and the first pole 133a of the light-sensitive identification apparatus 133 in the direction vertical to the organic light-emitting display panel forms the light-sensitive storage capacitor 135. It may be understood by one skilled in the art that, the structure of the light-sensitive storage capacitor includes, but is not limited to, the film structure as shown in FIG. 7. The structure of the light-sensitive storage capacitor in any of the existing light-sensitive identification structure falls into the protection scope of the disclosure.

Optionally, referring to FIG. 7, the organic light-emitting display panel includes a light-sensitive detection stage and a pressure-sensitive detection stage. In the light-sensitive detection stage, a common potential signal is applied to the common voltage input layer 134; the common voltage input layer 134 is multiplexed as the pressure-sensitive drive wiring of the pressure-sensitive detection structure 120, and in this way, in the pressure-sensitive detection stage, a pressure-sensitive drive signal is applied to the pressure-sensitive drive wiring. Or, the common voltage input layer 134 is multiplexed as the pressure-sensitive induction wiring of the pressure-sensitive detection structure 120, and in this way, in the pressure-sensitive detection stage, a pressure-sensitive induction signal is acquired via the pressure-sensitive induction wiring.

It needs to be noted that, each of the pressure-sensitive detection structures 120 includes two pressure-sensitive drive wirings. Optionally, at least one of the pressure-sensitive detection structures 120 is correspondingly provided with two common voltage input layers 134 that are multiplexed as the two pressure-sensitive drive wirings of the pressure-sensitive detection structure 120; each of the pressure-sensitive detection structures 120 respectively is correspondingly provided with two common voltage input layers 134 that are multiplexed as the two pressure-sensitive drive wirings of the corresponding pressure-sensitive detection structure 120; further, the two common voltage input layers 134 are multiplexed as the two pressure-sensitive drive wirings of each pressure-sensitive detection structure 120. Optionally, in conjunction with FIG. 1C, in the light-sensitive detection stage, the same signal may be input to the common potential signal applied to the common voltage input layer 134 and a certain one of the voltage input terminals (Vo+ and Vo−) in the pressure-sensitive detection stage.

It needs to be noted that, each of the pressure-sensitive detection structures 120 further includes two pressure-sensitive induction wirings. Optionally, at least one of the pressure-sensitive detection structures 120 is correspondingly provided with two common voltage input layers 134 that are multiplexed as the two pressure-sensitive induction wirings of the pressure-sensitive detection structure 120; each of the pressure-sensitive detection structures 120 respectively is correspondingly provided with two common voltage input layers 134 that are multiplexed as the two pressure-sensitive induction wirings of corresponding the pressure-sensitive detection structure 120; further, the two common voltage input layers 134 are multiplexed as the two pressure-sensitive drive wirings of each pressure-sensitive detection structure 120.

In the embodiment of the disclosure, under the premise that display, light-sensitive detection and pressure-sensitive detection are not affected, an appropriate number of common voltage input layers may be reasonably selected to be multiplexed as pressure-sensitive wirings according to panel design, formation process and manufacture cost, etc., which is not defined in the disclosure.

The light-sensitive detection stage of the organic light-emitting display panel includes a data write stage and a data read stage. In the data write stage, a common potential signal is applied to the common voltage input layer 134, wherein the common voltage signal is transferred to the second pole 133c of the light-sensitive identification apparatus 133 via the common voltage input layer 134, and the light-sensitive identification switch 131 is controlled to be turned on to transfer the light-sensitive data signal to the first pole 133a of the corresponding light-sensitive identification apparatus 133 via the first drain electrode D, and hence a first fixed potential is kept by the light-sensitive storage capacitor 135 formed between the common voltage input layer 134 and the first pole 133a of the light-sensitive identification apparatus 133, that is, data are written into the light-sensitive storage capacitor 135. When a finger touches the organic light-emitting display panel, the light-sensitive identification apparatus 133 will generate a corresponding current variation according to the intensity of the received reflected light, so that the potential of the light-sensitive storage capacitor 135 changes to a second potential. In the data read stage, the organic light-emitting display panel controls the light-sensitive identification switch 131 to be turned on, then the potential information of the light-sensitive storage capacitor 135 is read by the turned-on light-sensitive identification switch 131, and the finger texture information and/or finger location information are/is determined according to the potential information. On the other hand, on the basis that the common voltage input layer 134 is multiplexed as the pressure-sensitive wiring 122, in the light-sensitive detection stage, a common voltage signal is applied to each common voltage input layer 134 and each pressure-sensitive wiring 122, so that a common voltage potential is kept by the four pressure-sensitive wirings 122 of each pressure-sensitive detection structure 120 in the organic light-emitting display panel, so that a common voltage signal is input to both the two voltage input terminals and the two voltage output terminals of each of the pressure-sensitive detection structures 120, and at this time, each pressure-sensitive detection structure 120 in the organic light-emitting display panel does not work. Apparently, in the light-sensitive detection stage, the light-sensitive identification structure 130 works normally, and the pressure-sensitive detection structure 120 does not work, so that the pressure-sensitive detection structure 120 will not affect the light-sensitive detection process in the light-sensitive detection stage.

In the pressure-sensitive detection stage, the organic light-emitting display panel controls the light-sensitive identification switch 131 in the light-sensitive identification structure 130 to be turned off, and thus the light-sensitive identification structure 130 does not work, that is, the light-sensitive identification structure 130 will not affect the pressure-sensitive detection process in the pressure-sensitive detection stage. The four pressure-sensitive wirings 122 of the pressure-sensitive detection structure 120 are divided into two pressure-sensitive drive wirings and two pressure-sensitive induction wirings. Referring to FIG. 7, the common voltage input layer 134 is multiplexed as the pressure-sensitive drive wiring, so that in the pressure-sensitive detection stage, the organic light-emitting display panel applies a pressure-sensitive drive signal to the pressure-sensitive drive wiring of the pressure-sensitive detection structure 120. When a finger is pressed on the organic light-emitting display panel, the pressure-sensitive detection structure 120 will be deformed under the pressure, so that the pressure-sensitive induction wiring of the pressure-sensitive detection structure 120 outputs a pressure-sensitive induction signal. The organic light-emitting display panel acquires the pressure-sensitive induction signal and determines the magnitude of the pressure according to the pressure-sensitive induction signal, thereby realizing pressure-sensitive detection. Further, the common voltage input layer 134 is multiplexed as the pressure-sensitive induction wiring, so that in the pressure-sensitive detection stage, the organic light-emitting display panel applies a pressure-sensitive drive signal to the pressure-sensitive drive wiring of the pressure-sensitive detection structure 120. When a finger is pressed on the organic light-emitting display panel, the pressure-sensitive detection structure 120 will be deformed under the pressure, so that the pressure-sensitive induction wiring of the pressure-sensitive detection structure 120 outputs a pressure-sensitive induction signal. The organic light-emitting display panel acquires the pressure-sensitive induction signal and determines the magnitude of the pressure according to the pressure-sensitive induction signal, thereby realizing pressure-sensitive detection.

Figure 8A:
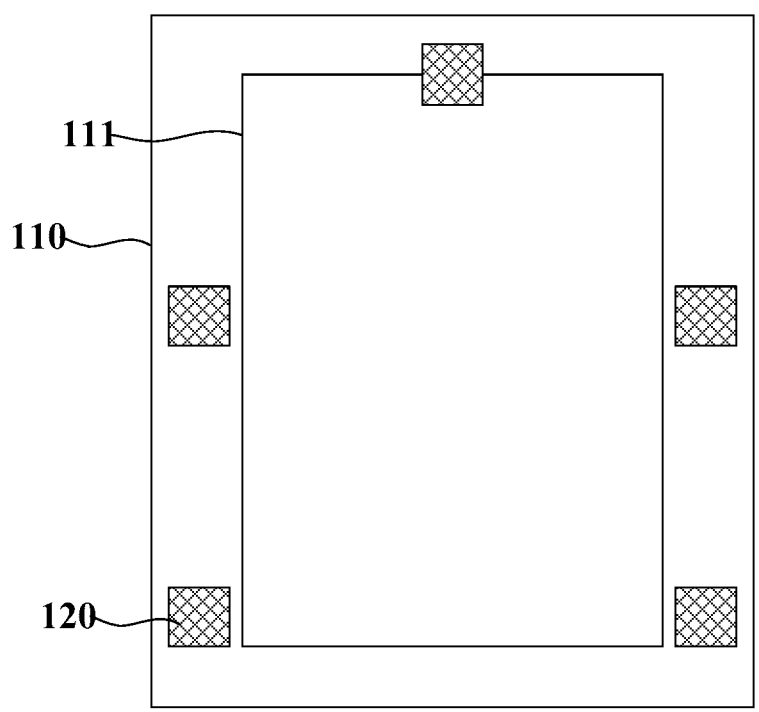
FIG. 8A-FIG. 8D are schematic diagrams of various organic light-emitting display panels according to the embodiments of the disclosure.
Figure 8B:
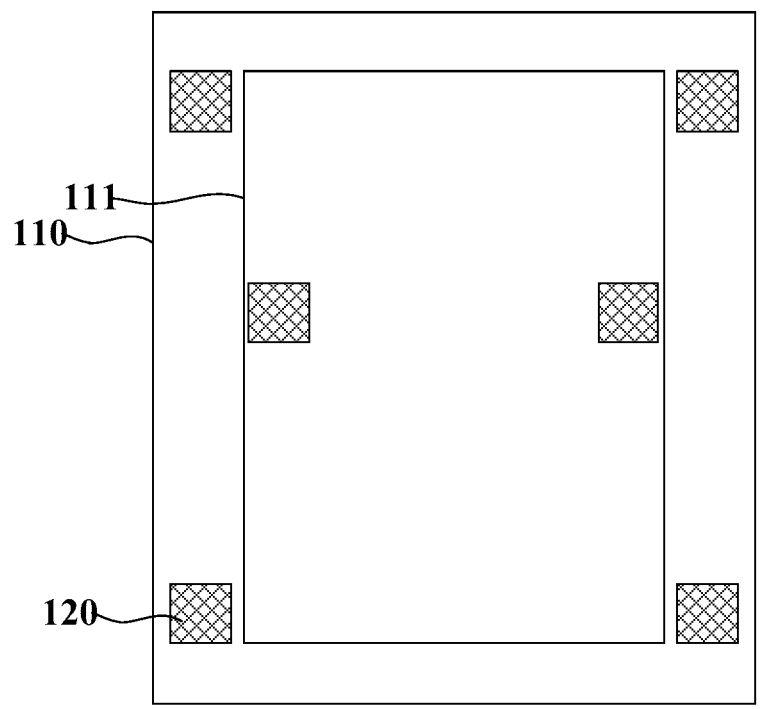
Figure 8C:
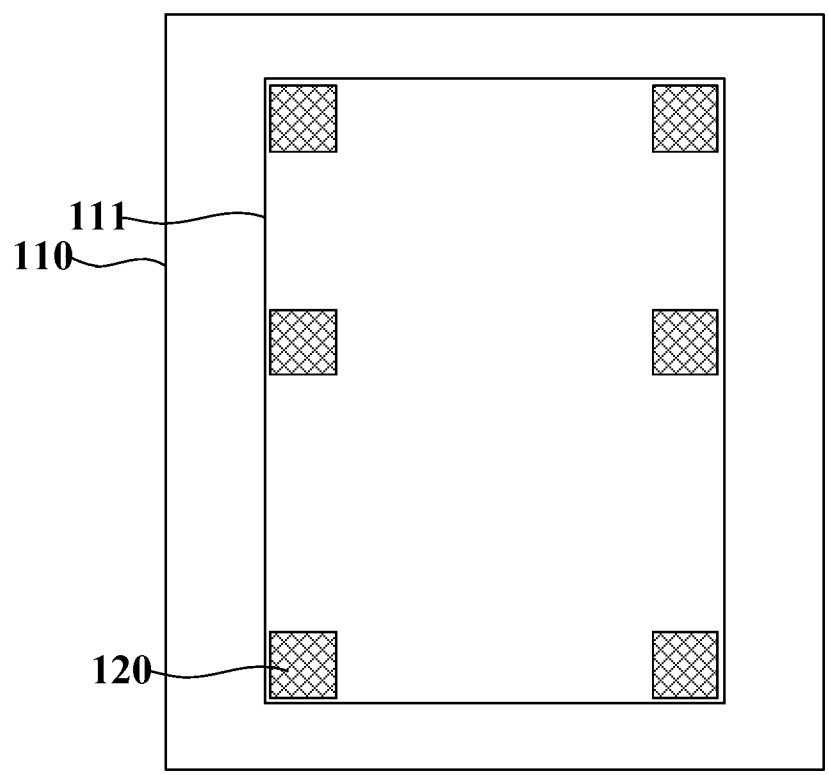
Figure 8D:
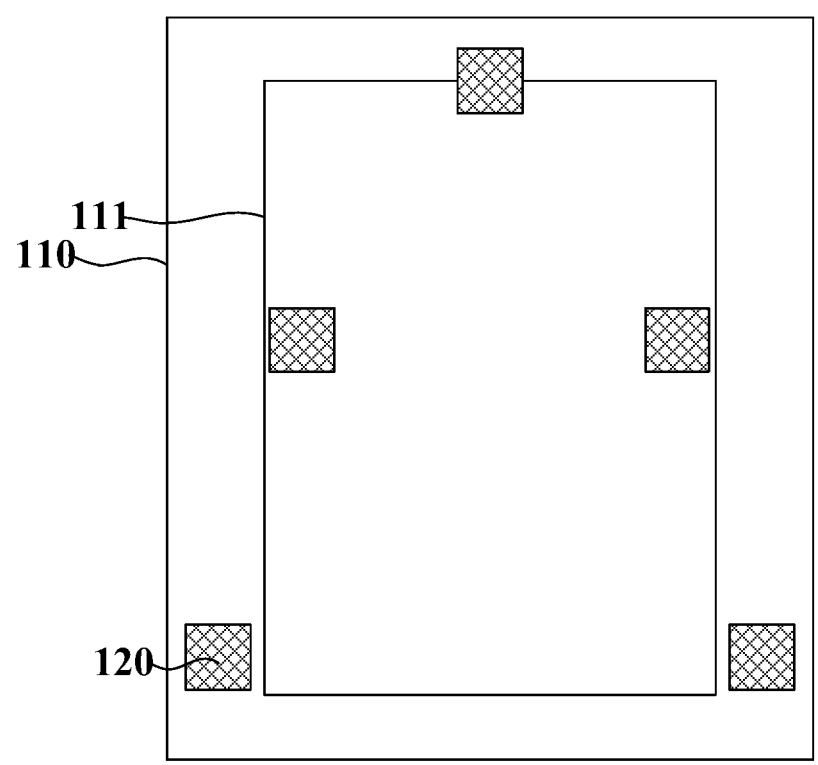

Optionally, in the embodiment of the disclosure, the first substrate includes a display region and a non-display region surrounding the display region, and at least one pressure-sensitive detection structure is provided in the display region of the first substrate. Referring to FIG. 8A, at least part of the pressure-sensitive detection structure 120 is provided in the display region 111 of the first substrate 110. Referring to FIG. 8B, at least one of the pressure-sensitive detection structures 120 is provided in the display region 111 of the first substrate 110. Referring to FIG. 8C, each of the pressure-sensitive detection structures 120 is provided in the display region 111 of the first substrate 110. Referring to FIG. 8D, at least part of at least one of the pressure-sensitive detection structures 120 is provided in the display region 111 of the first substrate 110, and at least one of the pressure-sensitive detection structures 120 is provided in the display region 111 of the first substrate 110.

In the embodiments of the disclosure, the arrangement mode of the pressure-sensitive detection structure is not specifically limited, and the pressure-sensitive detection structure may be provided in the display region of the first substrate or in the non-display region of the first substrate. The above various arrangement modes may also be recombined or combined with each other, and any arrangement mode of the pressure-sensitive detection structure in the organic light-emitting display panel will fall into the protection scope of the disclosure.

Figure 9:
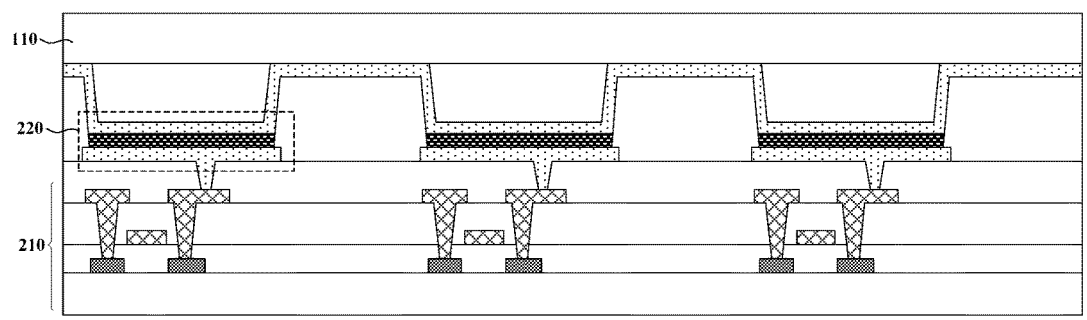
FIG. 9 is a schematic diagram of an organic light-emitting display panel according to an embodiment of the disclosure.

Optionally, referring to FIG. 9, in the embodiment of the disclosure, the organic light-emitting display panel further includes a second substrate 210 provided opposite to the first substrate 110, the first substrate 110 is an encapsulation glass of the organic light-emitting display panel, the second substrate 210 is an array substrate of the organic light-emitting display panel, and a plurality of organic light-emitting structures 220 are provided on the array substrate. The organic light-emitting display panel is of a top-emission type, and in other embodiments, the organic light-emitting display panel is of a bottom-emission type or a double-emission type. In the disclosure, the emission type of the organic light-emitting display panel is not specifically limited. In the embodiment of the disclosure, the display process of the organic light-emitting display panel is similar to those in the prior art, and it will not be described again here.

Figure 10A:
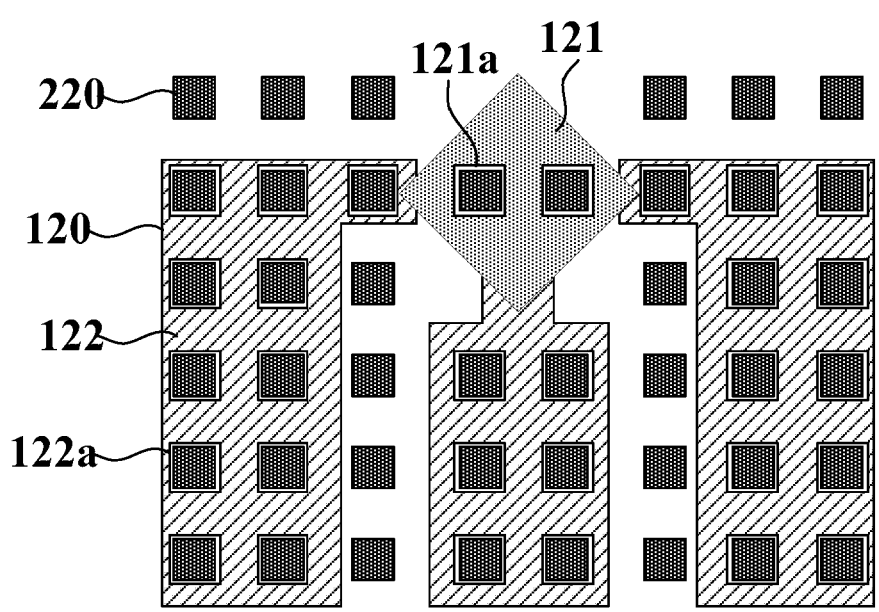
FIG. 10A-FIG. 10C are schematic diagrams of various organic light-emitting display panels according to the embodiments of the disclosure.
Figure 10B:
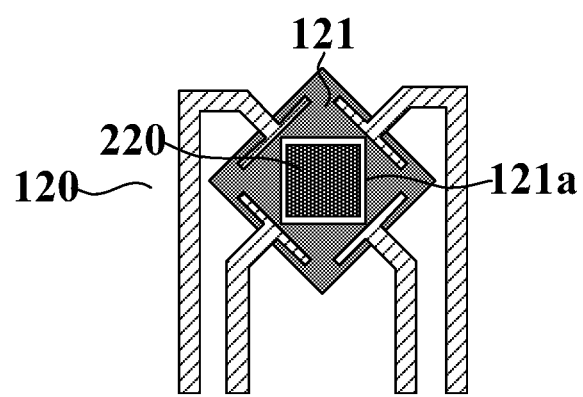
Figure 10C:
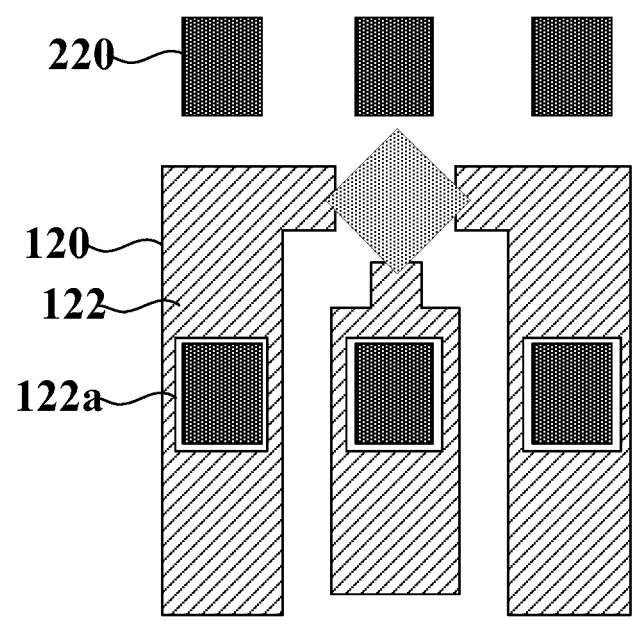

Optionally, on the basis of FIG. 9, referring to FIG. 10A-FIG. 10C, the projection of at least one of the pressure-sensitive detection structures 120 in the direction vertical to the organic light-emitting display panel covers at least one organic light-emitting structure 220, wherein, the pressure-sensitive wiring 122 of the pressure-sensitive detection structure 120 has at least one first opening 122a, and the projection of the first opening 122a in the direction vertical to the organic light-emitting display panel covers the at least one organic light-emitting structure 220, and/or, the semiconductor material film 121 of the pressure-sensitive detection structure 120 has at least one second opening 121a, and the projection of the second opening 121a in the direction vertical to the organic light-emitting display panel covers the at least one organic light-emitting structure 220.

Optionally, each of the covered organic light-emitting structures 220 corresponds to a first opening 122a or a second opening 121a. In this way, the display effect and the light-sensitive detection effect of the organic light-emitting display panel will not be affected by the pressure-sensitive detection structure covered thereon at all.

In the embodiment of the disclosure, the first substrate 110 functions as an encapsulation glass and covers the second substrate 210, and the first substrate 110 has a display region of corresponding to the light-emitting array formed of the organic light-emitting structure 220 of the second substrate 210, a plurality of pressure-sensitive detection structures 120 are further provided on one side of the first substrate 110 facing the second substrate 210, and the pressure-sensitive detection structure 120 includes a semiconductor material film 121 and four pressure-sensitive wirings 122, and the pressure-sensitive detection structure 120 may be provided in the display region of the first substrate 110. When the pressure-sensitive detection structure 120 is provided in the display region of the first substrate 110, the vertical projection thereof may cover the organic light-emitting structure 220. For example, the vertical projection of one pressure-sensitive detection structure 120 covers at least one organic light-emitting structure 220; the vertical projection of one pressure-sensitive detection structure 120 covers a plurality of organic light-emitting structures 220; the vertical projection of one pressure-sensitive detection structure 120 overlaps with the vertical projection of one organic light-emitting structure 220; or, the vertical projection of a plurality of pressure-sensitive detection structures 120 overlaps with the vertical projection of one organic light-emitting structure 220. Based on the area of the pressure-sensitive detection structure 120 and the area of the organic light-emitting structure 220 designed in different organic light-emitting display panels, there are different vertical projection overlapping circumferences, and it will not be described in all of the circumferences here.

Referring to FIG. 10A, it shows a situation in which the vertical projection of one pressure-sensitive detection structure 120 covers a plurality of organic light-emitting structures 220. The vertical projection of the semiconductor material film 121 of the pressure-sensitive detection structure 120 covers a plurality of organic light-emitting structures 220, and the vertical projection of the pressure-sensitive wiring 122 of the pressure-sensitive detection structure 120 covers a plurality of organic light-emitting structures 220. In this way, the semiconductor material film 121 has at least one second opening 121a, the projection of the second opening 121a in the direction vertical to the organic light-emitting display panel covers one organic light-emitting structure 220, and the pressure-sensitive wiring 122 has at least one first opening 122a, the projection of the first opening 122a in the direction vertical to the organic light-emitting display panel covers one organic light-emitting structure 220. Referring to FIG. 10B, the vertical projection of the semiconductor material film 121 of the pressure-sensitive detection structure 120 covers at least one organic light-emitting structure. In this way, the semiconductor material film 121 has at least one second opening 121a, and the projection of the second opening 121a in the direction vertical to the organic light-emitting display panel covers one organic light-emitting structure. Referring to FIG. 10C, the vertical projection of the pressure-sensitive wiring 122 of the pressure-sensitive detection structure 120 covers at least one organic light-emitting structure 220. In this way, the pressure-sensitive wiring 122 has at least one first opening 122a, and the projection of the first opening 122a in the direction vertical to the organic light-emitting display panel covers one organic light-emitting structure 220. In other embodiments, the projection of the second opening in the direction vertical to the organic light-emitting display panel covers at least one organic light-emitting structure, for example two organic light-emitting structures, and the projection of the first opening in the direction vertical to the organic light-emitting display panel covers at least one organic light-emitting structure, for example three organic light-emitting structures, which is not limited in the embodiments of the disclosure.

In the embodiment of the disclosure, the pressure-sensitive detection structure 120 is provided in the display region of the first substrate 110, so that narrow frame can be realized. Moreover, an opening is provided in the region of the pressure-sensitive detection structure 120 that corresponds to the organic light-emitting structure 220, thereby preventing the light emitted by the organic light-emitting structure 220 being blocked by the pressure-sensitive detection structure 120, so that the display effect of the organic light-emitting display panel can be guaranteed while realizing narrow frame.

It needs to be noted that, the first substrate further includes a plurality of light-sensitive identification structures arranged in an array. It may be understood by one skilled in the art that, the region of the light-sensitive identification structure that corresponds to the organic light-emitting structure is provided with a third opening (not shown), and the projection of the third opening in the direction vertical to the organic light-emitting display panel covers the organic light-emitting structure, thereby preventing the light emitted by the organic light-emitting structure being blocked by the light-sensitive identification structure.

Figure 11:
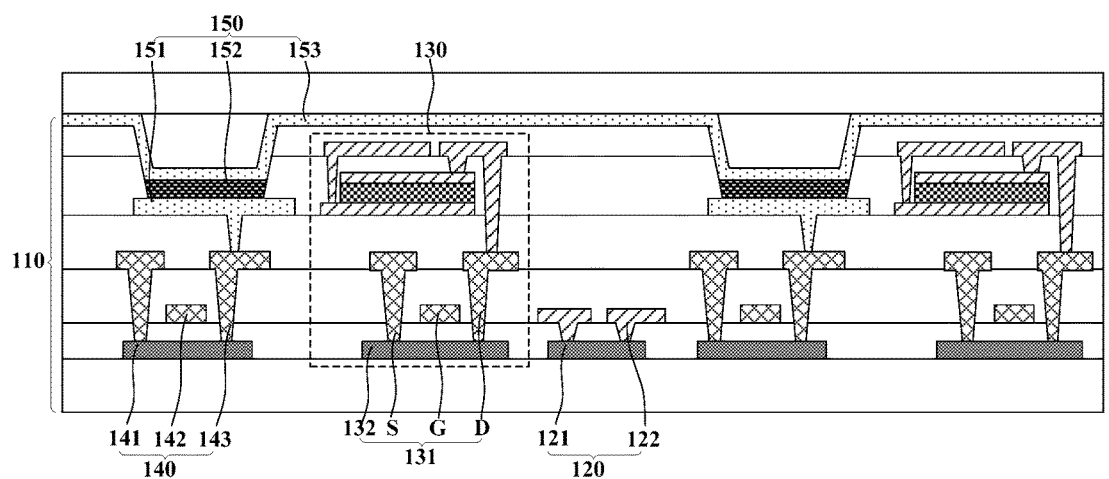
FIG. 11-FIG. 14 are schematic diagrams of various organic light-emitting display panels according to the embodiments of the disclosure.

Optionally, referring to FIG. 11, in an embodiment of the disclosure, the first substrate 110 of the organic light-emitting display panel is an array substrate of the organic light-emitting display panel, and the array substrate includes a plurality of pixel switches 140 and a plurality of organic light-emitting structures 150 corresponding to the plurality of pixel switches 140 respectively. The pixel switch 140 includes a second active layer 141, a second gate electrode 142 and a second drain electrode 143. The organic light-emitting structure 150 successively includes a first electrode 151, a light-emitting functional layer 152 and a second electrode 153 in the direction departing from the array substrate, wherein, the first electrode 151 of the organic light-emitting structure 150 is electrically connected with the second drain electrode 143 of the corresponding pixel switch 140. The first substrate 110 further includes a plurality of pressure-sensitive detection structures 120 and a plurality of light-sensitive identification structures 130 arranged in an array. The pressure-sensitive detection structure 120 includes a semiconductor material film 121 and a pressure-sensitive wiring 122, the light-sensitive identification structure 130 includes a light-sensitive identification switch 131, and the light-sensitive identification switch 131 includes a first active layer 132.

Referring to FIG. 11, the semiconductor material film 121, the first active layer 132 and the second active layer 141 are provided on the same layer; the second gate electrode 142 and the pressure-sensitive wiring 122 are provided on the same layer. In the embodiment of the disclosure, the semiconductor material film 121 of the pressure-sensitive detection structure 120, the first active layer 132 of the light-sensitive identification switch 131 and the second active layer 141 of the pixel switch 140 may be all formed via one mask, and the materials for the semiconductor material film 121 of the pressure-sensitive detection structure 120, the first active layer 132 of the light-sensitive identification switch 131 and the second active layer 141 of the pixel switch 140 are the same with each other, so that not only a plurality of mask processes can be omitted, but also a plurality of insulating layers and metal layers can be omitted, thereby lowering the costs, reducing the manufacture processes and reducing the thickness of the organic light-emitting display panel.

In the embodiment of the disclosure, the second gate electrode 142, the pressure-sensitive wiring 122 and the first gate electrode G of the light-sensitive identification switch 131 are provided on the same layer. The pressure-sensitive wiring 122 of the pressure-sensitive detection structure 120, the first gate electrode G of the light-sensitive identification switch 131 and the second gate electrode 142 of the pixel switch 140 may be all formed via one mask, and the materials for the pressure-sensitive wiring 122 of the pressure-sensitive detection structure 120, the first gate electrode G of the light-sensitive identification switch 131 and the second gate electrode 142 of the pixel switch 140 are the same with each other, so that not only a plurality of mask processes can be omitted, but also a plurality of insulating layers and metal layers can be omitted, thereby lowering the costs, reducing the manufacture processes and reducing the thickness of the organic light-emitting display panel.

In the embodiment of the disclosure, the first substrate 110 is an array substrate of the organic light-emitting display panel, so that a plurality of films on the array substrate can be multiplexed when making the light-sensitive identification structure 130 and the pressure-sensitive detection structure 120, thereby further reducing the making processes, lowering the costs and reducing the module thickness.

Figure 12:
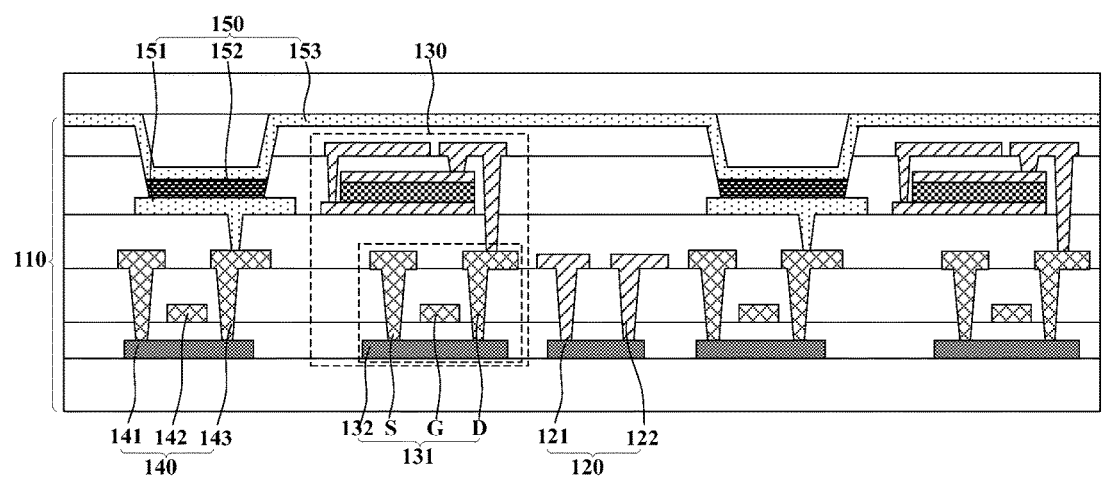

Optionally, referring to FIG. 12, the difference of the organic light-emitting display panel shown in FIG. 12 from that of FIG. 11 lies in that, the second drain electrode 143 and the pressure-sensitive wiring 122 are provided on the same layer. Further, the second drain electrode 143, the pressure-sensitive wiring 122 and the first drain electrode D of the light-sensitive identification switch 131 are provided on the same layer. In the embodiment of the disclosure, the pressure-sensitive wiring 122 of the pressure-sensitive detection structure 120, the first drain electrode D of the light-sensitive identification switch 131 and the second drain electrode 143 of the pixel switch 140 may be all formed via one mask, and the materials for the pressure-sensitive wiring 122 of the pressure-sensitive detection structure 120, the first drain electrode D of the light-sensitive identification switch 131 and the second drain electrode 143 of the pixel switch 140 are the same, so that not only a plurality of mask processes can be omitted, but also a plurality of insulating layers and metal layers can be omitted, thereby lowering the costs, reducing the manufacture processes and reducing the thickness of the organic light-emitting display panel.

Figure 13:
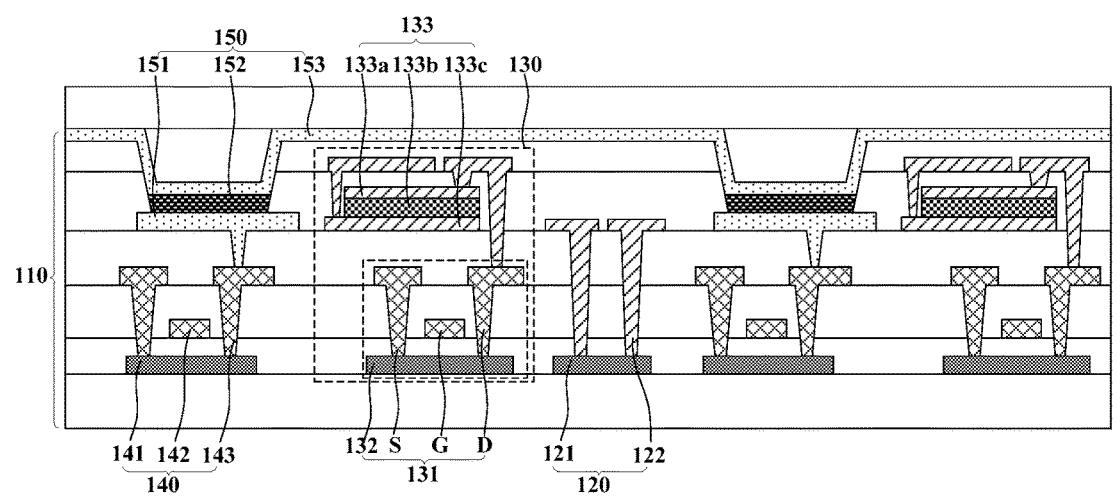

Optionally, referring to FIG. 13, the difference of the organic light-emitting display panel shown in FIG. 13 from that of FIG. 11-FIG. 12 lies in that, the first electrode 151 and the pressure-sensitive wiring 122 are provided on the same layer. Further, the first electrode 151 of the organic light-emitting structure 150, the pressure-sensitive wiring 122 of the pressure-sensitive detection structure 120 and the second pole 133c of the light-sensitive identification apparatus 133 are provided on the same layer. In the embodiment of the disclosure, the first electrode 151 of the organic light-emitting structure 150, the pressure-sensitive wiring 122 of the pressure-sensitive detection structure 120 and the second pole 133c of the light-sensitive identification apparatus 133 may be all formed via one mask, and the materials for the first electrode 151 of the organic light-emitting structure 150, the pressure-sensitive wiring 122 of the pressure-sensitive detection structure 120 and the second pole 133c of the light-sensitive identification apparatus 133 are the same with each other, so that not only a plurality of mask processes can be omitted, but also a plurality of insulating layers and metal layers can be omitted, thereby lowering the costs, reducing the manufacture processes and reducing the thickness of the organic light-emitting display panel.

Figure 14:
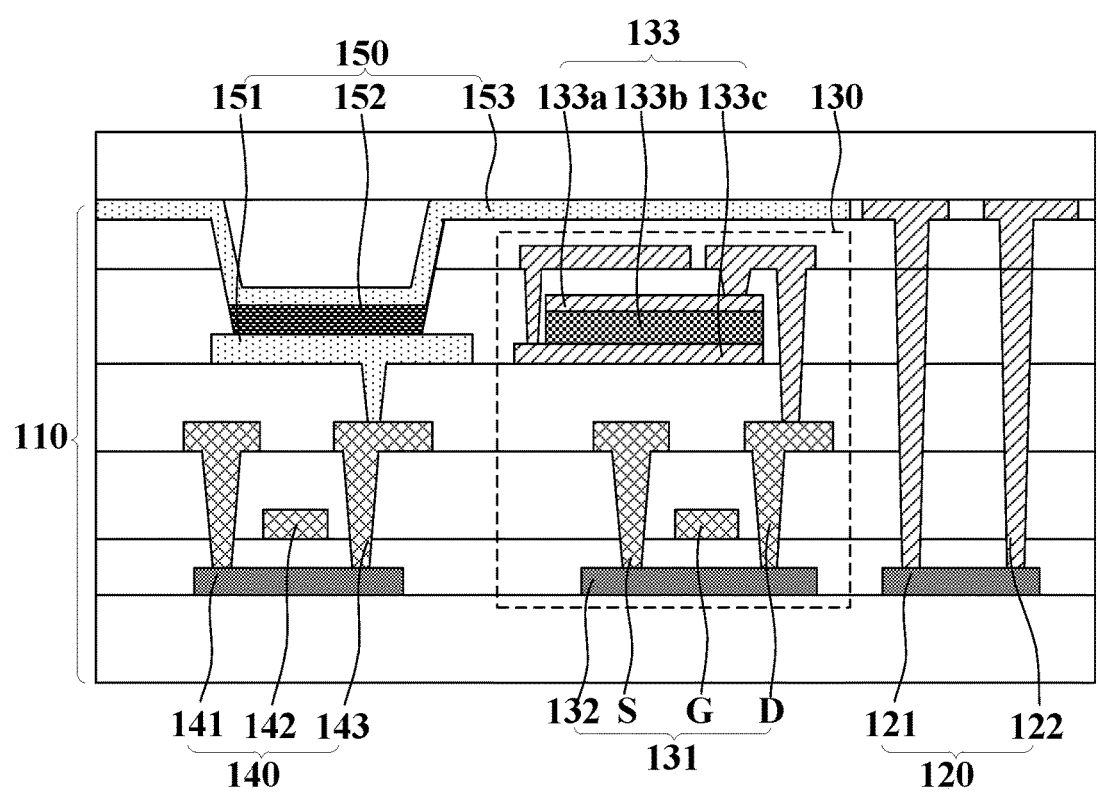

Optionally, referring to FIG. 14, the difference of the organic light-emitting display panel shown in FIG. 14 from that of FIG. 11-FIG. 13 lies in that, the second electrode 153 and the pressure-sensitive wiring 122 are provided on the same layer. In the embodiment of the disclosure, the second electrode 153 of the organic light-emitting structure 150 and the pressure-sensitive wiring 122 of the pressure-sensitive detection structure 120 may be both formed via one mask, and the materials for the second electrode 153 of the organic light-emitting structure 150 and the pressure-sensitive wiring 122 of the pressure-sensitive detection structure 120 are the same with each other, so that only a plurality of mask processes can be omitted, but also a plurality of insulating layers and metal layers can be omitted, thereby lowering the costs, reducing the manufacture processes and reducing the thickness of the organic light-emitting display panel. Or, the second electrode and the pressure-sensitive wiring are provided on the same layer. It needs to be noted that, without the affection on the light of the organic light-emitting structure 150, the pressure-sensitive detection structure 120 may be provided in the display region, and the second electrode 153 of the organic light-emitting structure 150 and the pressure-sensitive wiring 122 of the pressure-sensitive detection structure 120 are provided the same layer, and in this case, an opening is provided in the region of the second electrode 153 that corresponds to the pressure-sensitive detection structure 120, so that it is convenient for providing the pressure-sensitive wiring 122 in the opening.

It may be understood by one skilled in the art that, in the embodiments of the disclosure, the arrangement mode of the pressure-sensitive wiring includes, but is not limited to, the above-mentioned modes. Further, for example, the pressure-sensitive wiring may be provided on the same layer as the first pole of the light-sensitive identification apparatus in the array substrate, which will not be described again here.

It needs to be noted that, each of the above drawings merely shows a partial structure of the organic light-emitting display panel, rather than the whole structure of the organic light-emitting display panel. For other structures of the organic light-emitting display panel, reference may be made to the existing organic light-emitting display panels, and it will not be described again here. It may be understood by one skilled in the art that, in the organic light-emitting display panel, the film structure of the pressure-sensitive detection structure includes, but is not limited to, the above examples. Without the affection on the display function of the organic light-emitting display panel, the above various structures may be combined or recombined with each other, which will not be described in detail here.

Figure 15:
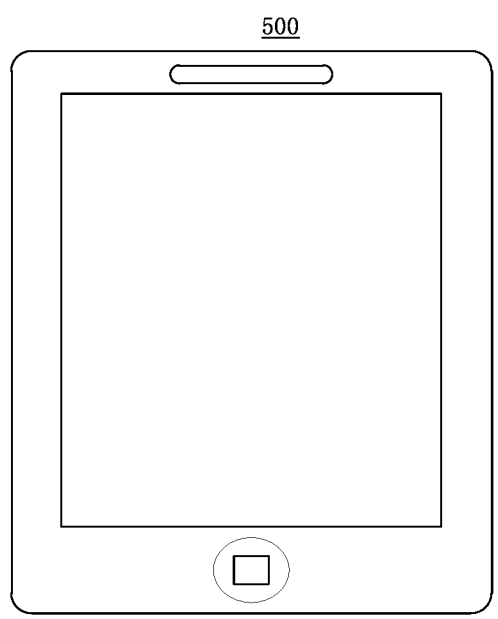
FIG. 15 is a schematic diagram of an electronic device according to an embodiment of the disclosure.

An embodiment of the disclosure further provides an electronic device, which includes any of the above organic light-emitting display panels. The electronic device may be any organic light-emitting display device that may be equipped with an organic light-emitting display panel, for example, an intelligent mobile phone and a tablet computer, etc. The electronic device is not specifically limited in the disclosure. Referring to FIG. 15, the electronic device 500 may be an intelligent mobile phone.

In the electronic device according to the embodiments of the disclosure, a pressure-sensitive detection structure and a light-sensitive identification structure are embedded in the organic light-emitting display panel thereof, and the pressure-sensitive detection structure and the light-sensitive identification structure share a part of the films and wirings, so that pressure-sensitive detection and light-sensitive detection can be both realized without affecting the display and adding the manufacture processes. Moreover, narrow frame can be also realized.

It should be noted that the embodiments of the present invention and the technical principles used therein are described as above. It should be appreciated that the invention is not limited to the embodiments described herein, and any apparent alterations, modification and substitutions can be made without departing from the scope of protection of the invention. Accordingly, while the invention is described in detail through the above embodiments, the invention is not limited to the above embodiments and can further include other additional embodiments without departing from the concept of the invention.

What is claimed is:

1. An organic light-emitting display panel, comprising:
a first substrate; wherein the first substrate comprises:
a plurality of pressure-sensitive detection structures, and a plurality of light-sensitive identification structures arranged in an array, wherein each of the pressure-sensitive detection structures comprises a semiconductor material film and a pressure-sensitive wiring electrically connected with the semiconductor material film, wherein each of the light-sensitive identification structures comprises a light-sensitive identification switch, and the light-sensitive identification switch comprises a first active layer, a first gate electrode and a first drain electrode, wherein the semiconductor material film and the first active layer are provided on the same layer
wherein the each of the light-sensitive identification structures further comprises: a light-sensitive identification apparatus provided corresponding to the light-sensitive identification switch;
wherein the light-sensitive identification apparatus comprises: a PN junction with a photosensitive characteristic, a first pole electrically connected with one end of the PN junction, and a second pole electrically connected with the other end of the PN junction, wherein the first pole of the light-sensitive identification apparatus is electrically connected with the first drain electrode corresponding to the light-sensitive identification switch
wherein the each of the light-sensitive identification structures further comprises: a common voltage input layer, the second pole of the light-sensitive identification apparatus is electrically connected with the common voltage input layer, and the common voltage input layer is multiplexed as the pressure-sensitive wiring.

2. The organic light-emitting display panel according to claim 1, wherein, the first substrate comprises a display region and a non-display region surrounding the display region, wherein at least one of the pressure-sensitive detection structures is provided in the display region of the first substrate.

3. The organic light-emitting display panel according to claim 2, further comprising: a second substrate provided opposite to the first substrate, wherein the first substrate is provided as an encapsulation glass of the organic light-emitting display panel, the second substrate is provided as an array substrate of the organic light-emitting display panel, and a plurality of organic light-emitting structures are provided on the array substrate.

4. The organic light-emitting display panel according to claim 3, wherein, a projection of at least one of the pressure-sensitive detection structures in a direction vertical to the organic light-emitting display panel covers at least one of the organic light-emitting structures, wherein, the pressure-sensitive wiring of the at least one pressure-sensitive detection structure has at least one first opening, a projection of which in a direction vertical to the organic light-emitting display panel covers the at least one organic light-emitting structure, and the semiconductor material film of the pressure-sensitive detection structure has at least one second opening, a projection of which in a direction vertical to the organic light-emitting display panel covers the at least one organic light-emitting structures.

5. The organic light-emitting display panel according to claim 4, wherein, each of the covered organic light-emitting structures corresponds to one of: the first openings and the second openings.

6. The organic light-emitting display panel according to claim 3, wherein, a projection of at least one of the pressure-sensitive detection structures in a direction vertical to the organic light-emitting display panel covers at least one of the organic light-emitting structures, wherein, the pressure-sensitive wiring of the at least one pressure-sensitive detection structure has at least one first opening, a projection of which in a direction vertical to the organic light-emitting display panel covers the at least one organic light-emitting structure.

7. The organic light-emitting display panel according to claim 3, wherein, a projection of at least one of the pressure-sensitive detection structures in a direction vertical to the organic light-emitting display panel covers at least one of the organic light-emitting structures, wherein, the semiconductor material film of the pressure-sensitive detection structure has at least one second opening, a projection of which in a direction vertical to the organic light-emitting display panel covers the at least one organic light-emitting structures.

8. The organic light-emitting display panel according to claim 1, wherein, the common voltage input layer and the pressure-sensitive wiring are provided on the same layer.

9. The organic light-emitting display panel according to claim 8, wherein, the organic light-emitting display panel comprises a light-sensitive detection stage and a pressure-sensitive detection stage;
in the light-sensitive detection stage, a common potential signal is applied to the common voltage input layer;
if the common voltage input layer is multiplexed as a pressure-sensitive drive wiring of the pressure-sensitive wiring of the pressure-sensitive detection structure, then in the pressure-sensitive detection stage, a pressure-sensitive drive signal is applied to the pressure-sensitive drive wiring.

10. The organic light-emitting display panel according to claim 8, wherein, the organic light-emitting display panel comprises a light-sensitive detection stage and a pressure-sensitive detection stage;
in the light-sensitive detection stage, a common potential signal is applied to the common voltage input layer;
wherein if the common voltage input layer is multiplexed as a pressure-sensitive induction wiring of the pressure-sensitive wiring of the pressure-sensitive detection structure, then in the pressure-sensitive detection stage, a pressure-sensitive induction signal is acquired by the pressure-sensitive induction wiring.

11. The organic light-emitting display panel according to claim 1, wherein, the pressure-sensitive wiring and one of the first gate electrode and the first drain electrode are provided on the same layer.

12. The organic light-emitting display panel according to claim 1, wherein, the pressure-sensitive wiring and one of the first pole and the second pole of the light-sensitive identification apparatus are provided on the same layer.

13. The organic light-emitting display panel according to claim 1, wherein, the organic light-emitting display panel comprises a light-sensitive detection stage and a pressure-sensitive detection stage;
in the light-sensitive detection stage, a common potential signal is applied to the common voltage input layer;
if the common voltage input layer is multiplexed as a pressure-sensitive drive wiring of the pressure-sensitive wiring of the pressure-sensitive detection structure, then in the pressure-sensitive detection stage, a pressure-sensitive drive signal is applied to the pressure-sensitive drive wiring.

14. The organic light-emitting display panel according to claim 1, wherein, the organic light-emitting display panel comprises a light-sensitive detection stage and a pressure-sensitive detection stage;
in the light-sensitive detection stage, a common potential signal is applied to the common voltage input layer;
if the common voltage input layer is multiplexed as a pressure-sensitive induction wiring of the pressure-sensitive wiring of the pressure-sensitive detection structure, then in the pressure-sensitive detection stage, a pressure-sensitive induction signal is acquired by the pressure-sensitive induction wiring.

15. An electronic device, comprising an organic light-emitting display panel, wherein the organic light-emitting display panel comprises:
a first substrate; wherein the first substrate comprises:
a plurality of pressure-sensitive detection structures, and
a plurality of light-sensitive identification structures arranged in an array, wherein each of the pressure-sensitive detection structures comprises a semiconductor material film and a pressure-sensitive wiring electrically connected with the semiconductor material film, wherein each of the light-sensitive identification structures comprises a light-sensitive identification switch, and the light-sensitive identification switch comprises a first active layer, a first gate electrode and a first drain electrode, wherein the semiconductor material film and the first active layer are provided on the same layer
wherein the each of the light-sensitive identification structures further comprises: a light-sensitive identification apparatus provided corresponding to the light-sensitive identification switch;
wherein the light-sensitive identification apparatus comprises: a PN junction with a photosensitive characteristic, a first pole electrically connected with one end of the PN junction, and a second pole electrically connected with the other end of the PN junction, wherein the first pole of the light-sensitive identification apparatus is electrically connected with the first drain electrode corresponding to the light-sensitive identification switch
wherein the each of the light-sensitive identification structures further comprises: a common voltage input layer, the second pole of the light-sensitive identification apparatus is electrically connected with the common voltage input layer, and the common voltage input layer is multiplexed as the pressure-sensitive wiring.

* * * * *